US008552756B2

(12) United States Patent
Huang et al.

(10) Patent No.: US 8,552,756 B2
(45) Date of Patent: Oct. 8, 2013

(54) CHIP TESTING APPARATUS AND TESTING METHOD THEREOF

(75) Inventors: Chih Hua Huang, Hsinchu Hsien (TW);
Chih Yen Chang, Hsinchu Hsien (TW)

(73) Assignee: Mstar Semiconductor, Inc., Hsinchu Hsien (TW)

( * ) Notice: Subject to any disclaimer, the term of this patent is extended or adjusted under 35 U.S.C. 154(b) by 277 days.

(21) Appl. No.: 12/547,555

(22) Filed: Aug. 26, 2009

(65) Prior Publication Data

US 2010/0052696 A1 Mar. 4, 2010

(30) Foreign Application Priority Data

Aug. 29, 2008 (TW) ................................ 97133169 A

(51) Int. Cl.
*G01R 31/26* (2006.01)
*H04Q 5/22* (2006.01)

(52) U.S. Cl.
USPC ............... 324/762.02; 324/762.01; 340/10.42

(58) Field of Classification Search
USPC ............ 324/762.01–762.06; 340/10.4–10.42
See application file for complete search history.

(56) References Cited

U.S. PATENT DOCUMENTS

| 4,504,783 | A * | 3/1985 | Zasio et al. ............... 324/750.01 |
| 7,120,550 | B2 * | 10/2006 | Diorio et al. .................. 702/107 |
| 7,123,039 | B2 * | 10/2006 | Gonzalez .................... 324/750.3 |
| 7,225,992 | B2 * | 6/2007 | Forster ........................... 235/492 |
| 7,253,651 | B2 * | 8/2007 | Khandros et al. ........ 324/762.05 |
| 7,279,920 | B2 * | 10/2007 | Kramer .................... 324/750.15 |
| 7,294,998 | B2 * | 11/2007 | Chiba ....................... 324/750.01 |
| 7,306,162 | B2 * | 12/2007 | Forster ........................... 235/492 |
| 7,994,807 | B1 * | 8/2011 | Koh et al. .................. 324/750.3 |
| 8,395,498 | B2 * | 3/2013 | Gaskill et al. ............. 340/539.12 |
| 8,457,904 | B2 * | 6/2013 | Burke et al. ..................... 702/19 |
| 2004/0160237 | A1 * | 8/2004 | Itoh et al. ....................... 324/765 |
| 2005/0240369 | A1 * | 10/2005 | Diorio et al. .................. 702/107 |
| 2006/0047545 | A1 * | 3/2006 | Kumar et al. ...................... 705/7 |
| 2006/0125506 | A1 * | 6/2006 | Hara et al. ...................... 324/765 |
| 2007/0084641 | A1 * | 4/2007 | Bayer et al. ................. 177/25.15 |
| 2007/0244657 | A1 * | 10/2007 | Drago et al. ..................... 702/81 |
| 2007/0273481 | A1 * | 11/2007 | Soleimani ..................... 340/10.1 |
| 2008/0183407 | A1 * | 7/2008 | Yeh et al. ......................... 702/60 |
| 2009/0137903 | A1 * | 5/2009 | Kim et al. ...................... 600/437 |
| 2010/0328047 | A1 * | 12/2010 | Jantunen et al. ............. 340/10.4 |
| 2011/0025472 | A1 * | 2/2011 | Kang ........................... 340/10.4 |

FOREIGN PATENT DOCUMENTS

| CN | 1542937 | 11/2004 |
| CN | 101251573 | 8/2008 |

\* cited by examiner

*Primary Examiner* — Joshua Benitez-Rosario
(74) *Attorney, Agent, or Firm* — WPAT, PC; Justin King

(57) ABSTRACT

A chip testing apparatus and a chip testing method are provided. The chip testing apparatus includes a command generating module, a transceiving module and a control module. When the command generating module generates a first test command, the transceiving module transmits the first test command to a radio frequency identification (RFID) chip and receives a target test result from the RFID chip. The control module determines whether the target test result complies with a reference test result. When the determination result of the control module is no, the control module controls the command generating module to generate a second test command for retesting the RFID chip.

20 Claims, 3 Drawing Sheets

CHIP TESTING APPARATUS AND TESTING METHOD THEREOF

CROSS REFERENCE TO RELATED PATENT APPLICATION

This patent application is based on a Taiwan, R.O.C. patent application No. 097133169 filed on Aug. 29, 2008.

FIELD OF THE INVENTION

The present invention relates to radio frequency identification (RFID), and more particularly, to an RFID chip testing apparatus and a testing method thereof.

BACKGROUND OF THE INVENTION

With respect to a manufacturer of an RFID tag, verification of whether the RFID tag contains errors or complies with definitions of one RFID protocol or various RFID protocols is an important task. In the prior art, each time before an RFID chip is tested, an RFID protocol supported by the chip needs to be confirmed in advance, then the chip is tested via a corresponding test command edited manually.

However, the RFID chip testing method costs a user a great deal of time and energy to edit the test command, and only a few of common test commands can be used for testing. The conventional RFID chip testing method is not capable of supplying a variety of testing items for expanding the scope of coverage of the test command; a function of automatically and randomly testing the RFID chip is not actually achieved.

As a result, one of the objectives of the invention is to provide a chip testing apparatus and a testing method thereof, so as to solve the problem mentioned above.

SUMMARY OF THE INVENTION

A chip testing apparatus is provided in accordance with an embodiment of the present invention. The chip testing apparatus is used for testing an RFID chip.

The chip testing apparatus comprises a command generating module, a transceiving module, and a control module. The command generating module generates a first test command. The transceiving module transmits the first test command generated by the command generating module to the RFID chip, and receives a target test result from the RFID chip. The control module determines whether the target test result complies with a reference test result. When the answer is no, the control module controls the command generating module to generate a second test command for retesting the RFID chip.

A chip testing method is provided in accordance with another embodiment of the present invention. The chip testing method is used for testing an RFID chip.

In the method, a first test command is generated. The first test command is then transmitted to the RFID chip, and a target test result is received from the RFID chip. It is determined whether the target test result complies with a reference test result. When the answer is no, a second test command is generated to retest the RFID chip.

In comparing to the prior art, a function of automatically, randomly, and repeatedly testing the RFID chip is achieved by the chip testing apparatus and the testing method thereof according to the present invention. In the prior art, a type of a protocol supported by the RFID chip needs to be confirmed in advance, then the RFID chip is tested via a corresponding test command edited manually. The chip testing apparatus according to the present invention can save time and energy from editing the test command; and the scope of coverage for the test commands of the RFID chip is expanded via a random and repeated testing manner.

The advantages and spirit related to the present invention can be further understood via the following detailed description and drawings.

DETAILED DESCRIPTION OF THE PREFERRED EMBODIMENT

Figure 1:
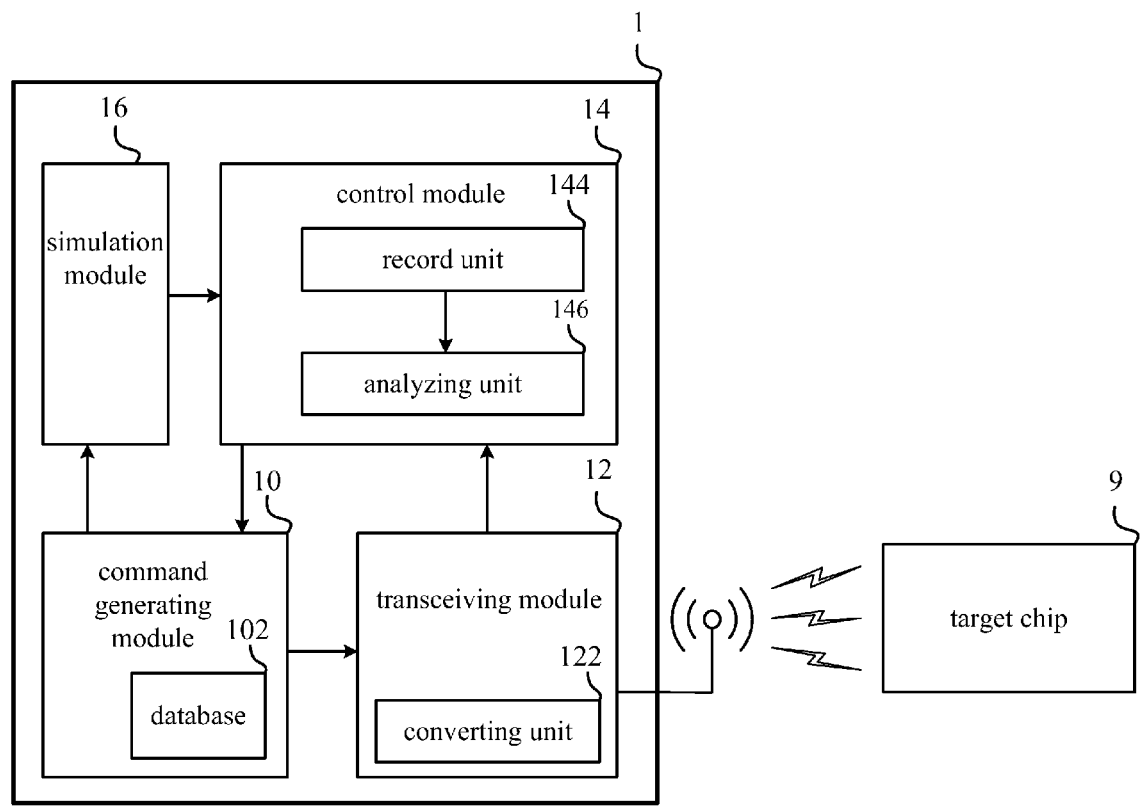
FIG. 1 is a functional block diagram of a chip testing apparatus in accordance with a first embodiment of the present invention.

A chip testing apparatus is provided in accordance with a first embodiment of the present invention. Refer to FIG. 1 showing a functional block diagram of the chip testing apparatus. A chip testing apparatus 1 comprises a command generating module 10, a transceiving module 12, and a control module 14. In this embodiment, the function of the chip testing apparatus is to test a target chip 9. In practice, the target chip 9 is an RFID chip or other chips.

The command generating module 10 generates a first test command according to a controlling signal of the control module 14. In practice, the command generating module 10 can randomly generate the first test command. Therefore, the first test command is a random number or complies with a command defined by an RFID protocol.

The transceiving module 12, coupled to the command generating module 10, transmits the first test command to the target chip 9 and receives a target test result from the target chip 9. In a practical application, the transceiving module 12 can be a chip reader, such as an RFID chip reader. Referring to FIG. 1, the transceiving module 12 performs signal transmission of the first test command or signal receiving of the target test result with the target chip 9 via an antenna. In addition, the transceiving module 12 is coupled to the target chip 9 in a wired manner in order to transmit the signal.

Moreover, a signal format supported by the target chip 9 may be different from that by the chip testing apparatus 1. Hence, the transceiving module 12 can comprise a converting unit 122. Before the first test command is transmitted to the target chip 9, the converting unit 122 converts the signal format of the first test command to a target signal format complying with the target chip 9. For example, when the target chip 9 is the RFID chip, the converting unit 122 shall convert the signal format of the first test command to an RFID signal format.

The control module 14, coupled to the transceiving module 12 and the command generating module 10, determines whether the target test result complies with a reference test result. In other words, the control module 14 determines whether the target chip 9 passes a test of the first test command according to the target test result. When the answer is no, meaning that the target chip 9 fails the test of the first test command; when the answer is yes, meaning that the target chip 9 passes the test of the first test command. After the first test command, the control module 14 instructs the command generating module 10 to generate a second test command for retesting or continuing testing the target chip 9.

In a practical application, the first test command is different from the second test command which is randomly generated by the command generating module 10. The reference test result mentioned above is generated via the various different manners to be discussed below.

In a first circumstance, the reference test result is achieved by simulation. The chip testing apparatus 1 can further comprise a simulation module 16 in the first circumstance. Referring to FIG. 1, the simulation module 16 is coupled to the command generating module 10 and the control module 14. The simulation module 16 simulates a response of a standard chip according to the first test command to generate the reference test result.

In a second circumstance, the reference test result is achieved by searching. The command generating module 10 can comprise a database 102 stored with a plurality of test results including the reference test result in the second circumstance. When the command generating module 10 generates the first test command, the reference test result corresponding to the first test command is selected from the plurality of test results stored in the database 102. In practice, the plurality of test results stored in the database 102 can be test results achieved in previous tests or be predetermined test results.

In a third circumstance, the reference test result is achieved by using a standard comparison chip. Specifically, the comparison is achieved using a standard comparison chip corresponding to the target chip 9. In response to the first test command received by the comparison chip, the comparison chip generates a comparison test result regarded as the reference test result.

Referring to FIG. 1, in a practical application, the control module 14 comprises a record unit 144 and an analyzing unit 146. Regardless of a result of the control module 14, the record unit 144 of the control module 14 records an identification code, the first test command, the target test result of the target chip 9 and the reference test result for serving as information of the chip test history. The analyzing unit 146 statistically analyzes types of RFID protocols supported by the target chip 9 and a test command complying with the RFID protocols according to the information recorded by the record unit 144, so that the statistical analysis may serve as a reference for a future test.

Figure 2:
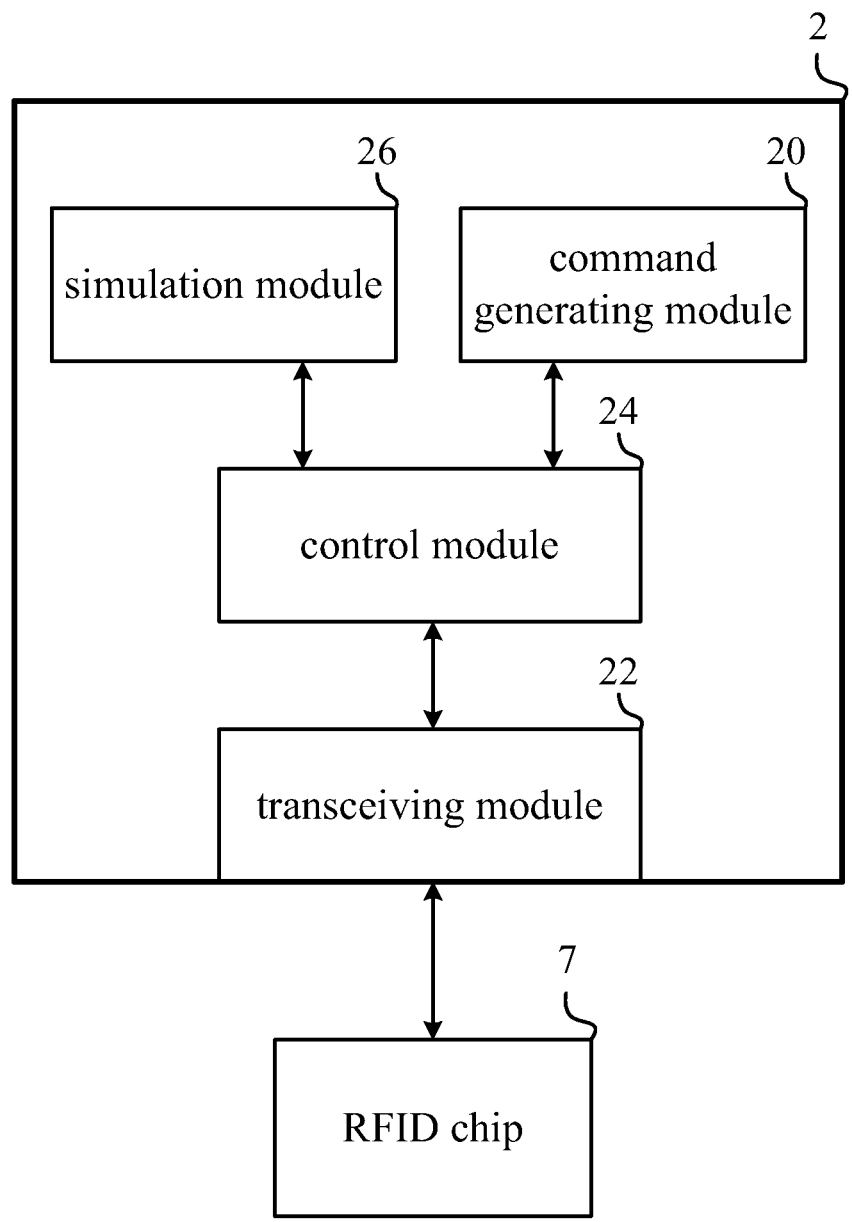
FIG. 2 is an example of the chip testing apparatus.

By taking a practical application as an example, actual operations according to the chip testing apparatus of the present invention shall be illustrated. Referring to FIG. 2, for example, the chip test apparatus is an RFID chip test apparatus 2, for testing an RFID chip 7. In addition to transmitting information via a radio frequency signal, the RFID chip testing apparatus 2 can be coupled to the RFID chip 7 in a wired manner.

When a test begins, a control module 24 of the RFID chip testing apparatus 2 generates a controlling signal to be transmitted to a command generating module 20, so as to control the command generating module 20 to generate a first test command. Since the command generating module 20 can randomly generate the first test command, the first command may be a reasonable command complying with one RFID protocol, or different RFID protocols, or an unreasonable command violating any RFID protocol.

When the command generating module 20 generates the first test command, the control module 24 receives and records the first test command and transmits the first test command to a simulation module 26. When the first test command is received, the simulation module 26 simulates a response to the first test command of the RFID chip 7 and generates a reference test result.

The control module 24 then receives and records the reference test result, and transmits a signal comprising the first test command to a transceiving module 22. A signal format of the RFID chip testing apparatus 2 may be different from that of the RFID chip 7. Therefore, when the signal comprising the first test command is received, the transceiving module 22 converts the signal format to a signal format complying with the RFID chip 7 and then transmits the signal comprising the first test command to the RFID chip 7 in a wireless or wired manner. In this example, suppose the transceiving module 22 is coupled to the RFID chip in the wired manner.

When the signal comprising the first test command is received, the RFID chip 7 generates a target test result in response to the first test command. The RFID chip 7 then transmits a signal comprising the target test result to the RFID chip testing apparatus 2. When the signal comprising the target test result is received, the transceiving module 22 of the RFID chip testing apparatus 2 converts the signal format to comply with the RFID chip testing apparatus 2 and then transmits the target test result to the control module 24. The control module 24 determines whether the target test result complies with the reference test result previously recorded, and determines whether the RFID chip 7 passes a test of the first test command according to whether the target test result complies with the reference test result.

When the determination result of the control module 24 is yes, that is, when the responded target test result of the RFID chip 7 complies with the simulated reference test result, the control module 24 accordingly determines the RFID chip 7 passes the test of the first test command. When the determination result of the control module 24 is no, that is, when the responded target test result of the RFID chip 7 does not comply with the simulated reference test result, the control module 24 determines the RFID chip 7 fails the test of the first test command.

Regardless of the determination result of the control module 24 being yes or no, that is, regardless whether the responded target test result of the RFID chip 7 complies with the simulated reference test result, the control module 24 continually generates a new control signal, which controls the command generating module 20 to generate a second test command for retesting the RFID chip 7. In practice, the second test command is different from the first test command.

In view of the description of the foregoing embodiment, the chip testing apparatus according to the present invention is capable of achieving a function of automatically and randomly testing the RFID chip via constant and repeated tests, as well as providing more extensive chip test command items to expand coverage of the RFID chip test.

Figure 3:
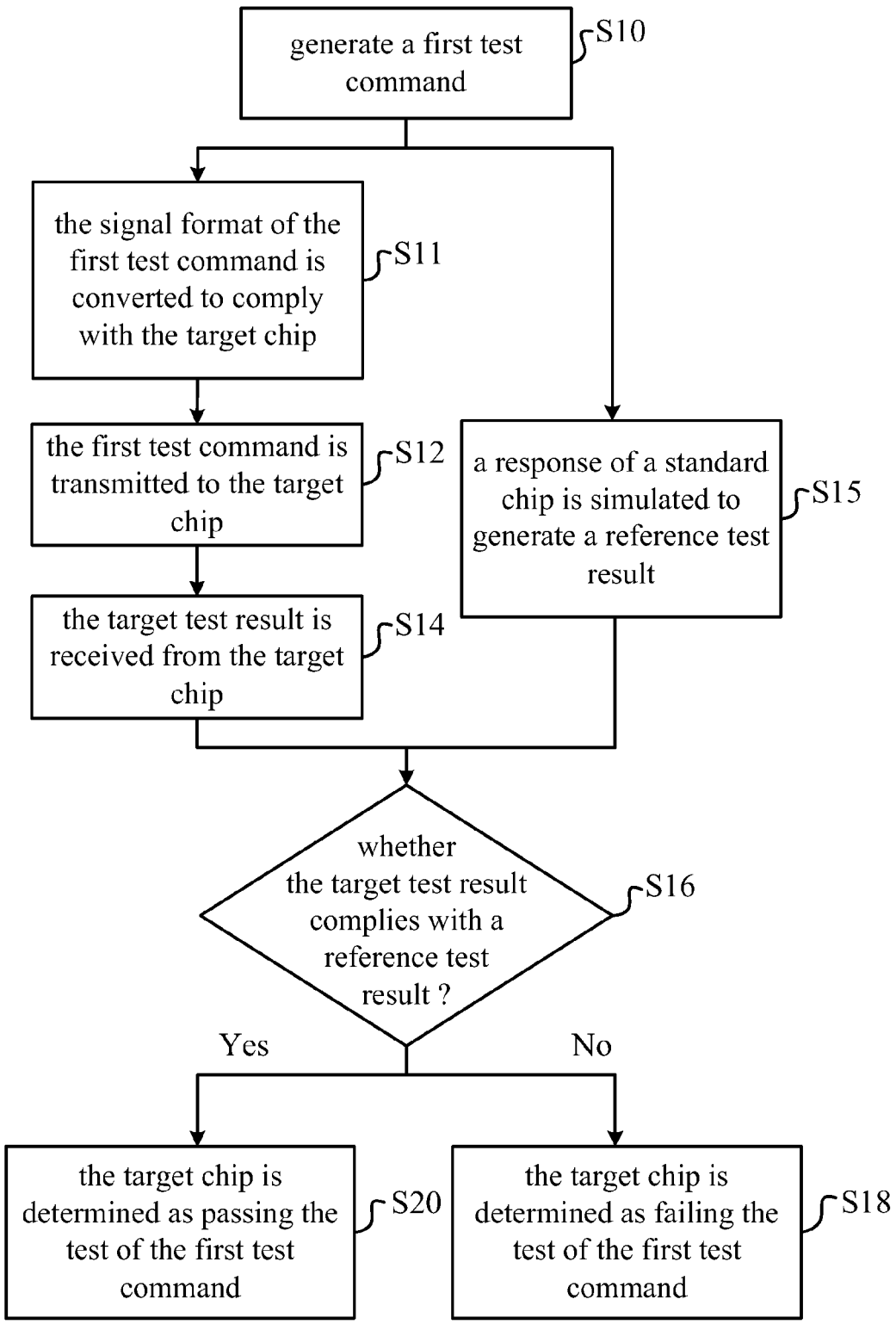
FIG. 3 is a flow chart of a chip testing method in accordance with a second embodiment of the present invention.

A chip testing method is provided according to a second embodiment of the present invention. The chip testing method is used for testing a target chip, such as an RFID chip. Refer to FIG. 3 showing a flow chart of the chip testing method. The chip testing method begins with Step S10 of generating a first test command. In a practical application, a signal format of the first test command may be different from that by a target chip. As a result, in Step S11, the signal format of the first test command is converted to comply with the target chip.

In Step S12, the first test command is transmitted to the target chip. When the first test command is received, the target chip generates a target test result in response to the first test command. In Step S14, the target test result is received from the target chip.

Following Step S10 of generating the first test command, Step S15 is executed. In Step S15, a response of a standard chip is simulated to generate a reference test result. When the standard chip has the same type and specification as the target chip, that is, when the target chip is a qualified chip, the target test result generated by the target chip should be the same as the simulated reference test result, meaning that the target chip passes the test.

When the responded target test result of the target chip and the simulated reference test result are generated, Step S16 of determining whether the target test result complies with a reference test result is executed. The objective of executing Step S16 is to determine whether the target chip passes the test of the first test command.

When the determination result of Step S16 is yes, the responded target test result of the target chip complies with the simulated reference test result, and Step S20 is executed. In Step S20, it is determined that the target chip passes the test of the first test. When the determination result of Step S16 is no, Step S18 is executed. In Step S18, it is determined that the target chip fails the test of the first test command. Regardless whether the target chip passes the test of the first test command, a second test command is generated to retest the target chip after Step S18 or Step S20 is executed. In practice, the second test command is different from the first test command.

Compared to the prior art, the chip testing apparatus and the chip testing method thereof according to the present invention are capable of achieving a function of automatically and randomly testing the RFID chip. In the prior art, a type of a protocol supported by the RFID chip should be confirmed in advance, then the RFID chip is tested via a corresponding test command edited manually. The chip testing apparatus according to the present invention can save time and energy of editing the test command, and a scope of coverage of the test command of the RFID chip is expanded via a random and repeated testing manner.

While the invention has been described in terms of what is presently considered to be the most practical and preferred embodiments, it is to be understood that the invention needs not to be limited to the above embodiments. On the contrary, it is intended to cover various modifications and similar arrangements included within the spirit and scope of the appended claims which are to be accorded with the broadest interpretation so as to encompass all such modifications and similar structures.

What is claimed is:

1. A chip testing apparatus for testing a radio frequency identification (RFID) chip, comprising:
    a command generating module, for generating a first test command;
    a transceiving module, configured for:
        transmitting the first test command to the RFID chip, and receiving a target test result from the RFID chip;
    a reference test result providing unit, for providing a reference test result; and
    a control module coupled to the transceiving module and the command generating module, configured for:
        controlling the command generating module to generate the first test command;
        determining whether the target test result complies with a the reference test result; and
        controlling the command generating module to generate a second test command for retesting the RFID chip;
    wherein, the command generating module, the transceiving module, and the control module are modular and functionally independent.

2. The chip testing apparatus as claimed in claim 1, wherein the second test command is different from the first test command.

3. The chip testing apparatus as claimed in claim 1, wherein the RFID chip is coupled to the transceiving module in a wired manner, whereby receiving the first test command or transmit the target test result.

4. The chip testing apparatus as claimed in claim 1, wherein the transceiving module comprises:
    a converting unit, for converting a signal format of the first test command to a target signal format complying with the RFID chip.

5. The chip testing apparatus as claimed in claim 1, the reference test providing unit further comprising:
    a simulation module, for generating the reference test result by simulating a response of a standard chip to the first test command.

6. The chip testing apparatus as claimed in claim 1, the reference test providing unit further comprising:
    a standard comparison chip corresponding to a target chip, for generating a comparison test result regarded as the reference test result according to the first test command.

7. The chip testing apparatus as claimed in claim 1, wherein the command generating module comprises:
    a database, storing a plurality of test results, wherein when the first test command is generated, the command generating module selects the reference test result corresponding to the first test command from the database.

8. The chip testing apparatus as claimed in claim 1, wherein the command generating module randomly generates the first test command and the second test command.

9. The chip testing apparatus as claimed in claim 1, wherein the control module controlling the command generating module to generate the second test command for retesting the RFID chip when the target test result fails to comply with the reference test result.

10. The chip testing apparatus as claimed in claim 1, wherein the first test command complies with a command defined by an RFID protocol.

11. The chip testing apparatus as claimed in claim 1, wherein the control module comprises:
    a record unit, for recording an identification code, the first test command, the target test result of a target chip, and the reference test result, for serving as information of a chip test history; and
    an analyzing unit, for analyzing types of RFID protocols supported by the target chip and a test command complying with the RFID protocols according to the information recorded by the record unit.

12. A chip testing method for testing functionality of an RFID chip, performed by physical circuitry, comprising steps of:
    (a) generating a first test command using a modular and functionally independent first module controlled by a modular and functionally independent third module;
    (b) transmitting the first test command to the RFID chip using a modular and functionally independent second module;
    (c) receiving a target test result from the RFID chip using the second module;
    (c)(1) providing a reference test result;
    (d) determining whether the target test result complies with the reference test result using the third module; and
    (e) automatically generating a second test command for retesting the RFID chip using the third module.

13. The chip testing method as claimed in claim 12, wherein the second test command is different from the first test command.

14. The chip testing method as claimed in claim 12, further comprising a step of:

(f) converting a signal format of the first test command to a target signal format complying with the RFID chip.

15. The chip testing method as claimed in claim 12, further comprising a step of:
(g) generating the reference test result by simulating the first test command.

16. The chip testing method as claimed in claim 12, further comprising a step of:
(h) transmitting the first test command to a comparison chip and generating the reference test result according to a response of the comparison chip.

17. The chip testing method as claimed in claim 12, wherein the step (a) further comprising:
selecting the reference test result corresponding to the first test command from a database.

18. The chip testing method as claimed in claim 12 wherein the first test command and the second test command are randomly generated.

19. The chip testing method as claimed in claim 12, wherein the step (b) further comprising transmitting the first test command to the RFID chip via a wire.

20. The chip testing method as claimed in claim 12, wherein the second test command is generated when the target test result fails to comply with the reference test result.

* * * * *